(12) United States Patent
Surana et al.

(10) Patent No.: US 11,862,282 B2
(45) Date of Patent: Jan. 2, 2024

(54) ONE TRANSISTOR MEMORY BITCELL WITH ARITHMETIC CAPABILITY

(71) Applicant: Ceremorphic, Inc., San Jose, CA (US)

(72) Inventors: Neelam Surana, Palaj (IN); Robert F. Wiser, Santa Cruz, CA (US)

(73) Assignee: Ceremorphic, Inc., San Jose, CA (US)

(*) Notice: Subject to any disclaimer, the term of this patent is extended or adjusted under 35 U.S.C. 154(b) by 0 days.

(21) Appl. No.: 17/555,474

(22) Filed: Dec. 19, 2021

(65) Prior Publication Data

US 2023/0197121 A1 Jun. 22, 2023

(51) Int. Cl.
G11C 7/06 (2006.01)
G11C 7/12 (2006.01)
H03K 19/20 (2006.01)
G11C 7/10 (2006.01)

(52) U.S. Cl.
CPC ............ G11C 7/062 (2013.01); G11C 7/1069 (2013.01); G11C 7/1096 (2013.01); G11C 7/12 (2013.01); H03K 19/20 (2013.01)

(58) Field of Classification Search
CPC ..... G11C 7/062; G11C 7/1069; G11C 7/1096; G11C 7/12; H03K 19/20
USPC ...................................................... 365/189.07
See application file for complete search history.

(56) References Cited

U.S. PATENT DOCUMENTS

| | | | |
|---|---|---|---|
| 5,940,324 A * | 8/1999 | Chi | H01L 29/7881 257/314 |
| 2014/0241042 A1* | 8/2014 | Park | G11C 29/021 365/148 |
| 2018/0082732 A1* | 3/2018 | Luo | G11C 8/08 |

* cited by examiner

*Primary Examiner* — Huan Hoang
(74) *Attorney, Agent, or Firm* — File-EE-Patents.com; Jay A. Chesavage

(57) ABSTRACT

A memory performing logic functions has two single transistor static ram memory (STSRAM) with drain, source, and gate terminal which can be written, read, and when read, generates an output current. The STSRAMs have drain and source connected in parallel, and when read, generate a current provided to a current comparator amplifier (CCA) which is compared to a reference current $I_{ref}$ to generate an output which is at least one of a logical AND, logical NAND, logical OR, logical NOR, or logical exclusive OR (XOR).

20 Claims, 5 Drawing Sheets

6T Memory Cell (Prior Art)

1T/2T SRAM Cell Construction

Equiv Circuit 2 bit STSRAM memory cell

STSRAM modes

| Terminal | Write 1 | Write 0 | Read |
|---|---|---|---|
| WL (Gate) | 0.8V | −0.3V | 0.4V |
| SL (Drain) | 0.8V | −0.3V | 0.2V |
| BL (Source) | 0V | 0V | meas IBL(0V) |

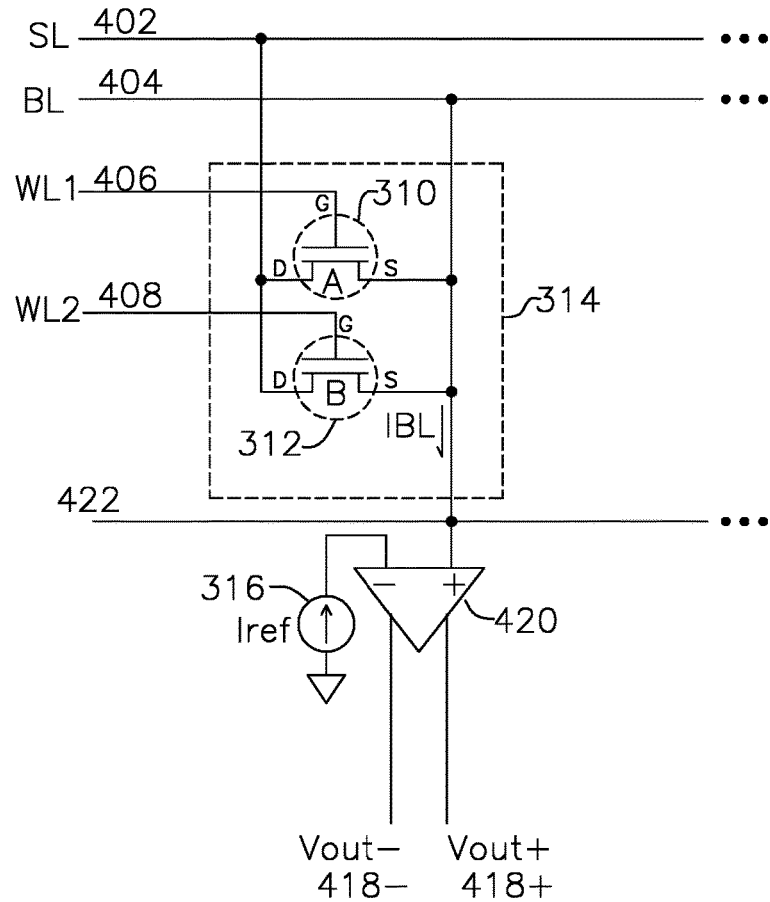
*Figure 4A*
1T/2T SRAM
NOR/OR Operation
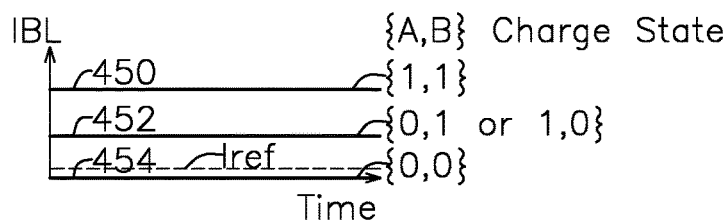
*Figure 4B*
IBL vs A,B Charge State (Iref=Iref00)
*Figure 4C*
| A | B | Vout+ | Vout− |
|---|---|-------|-------|
| 0 | 0 | 0 | 1 |
| 0 | 1 | 1 | 0 |
| 1 | 0 | 1 | 0 |
| 1 | 1 | 1 | 0 |

Figure 5A
1T/2T SRAM
NAND/AND Operation
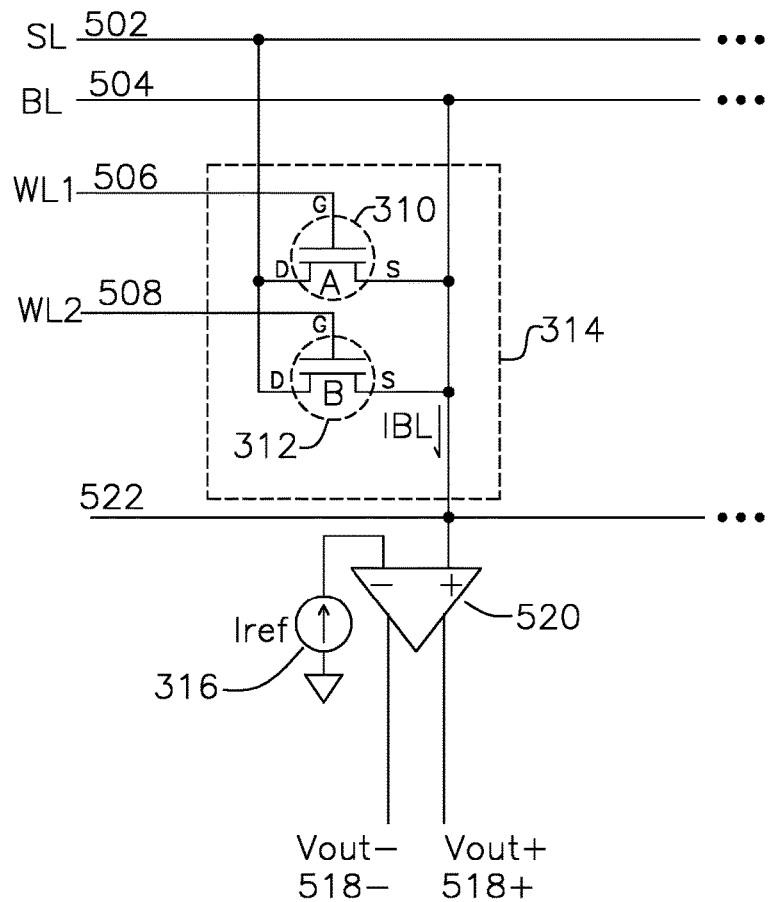
Figure 5B
IBL vs A,B Charge State (Iref=Iref11)
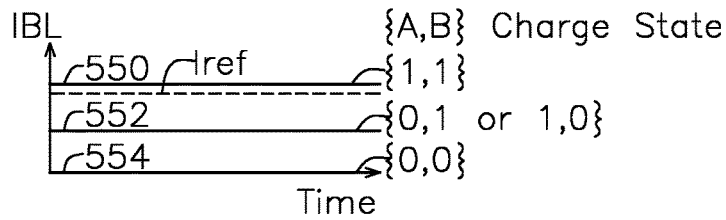
Figure 5C
| A | B | Vout+ | Vout− |
|---|---|-------|-------|
| 0 | 0 | 0 | 1 |
| 0 | 1 | 0 | 1 |
| 1 | 0 | 0 | 1 |
| 1 | 1 | 1 | 0 |

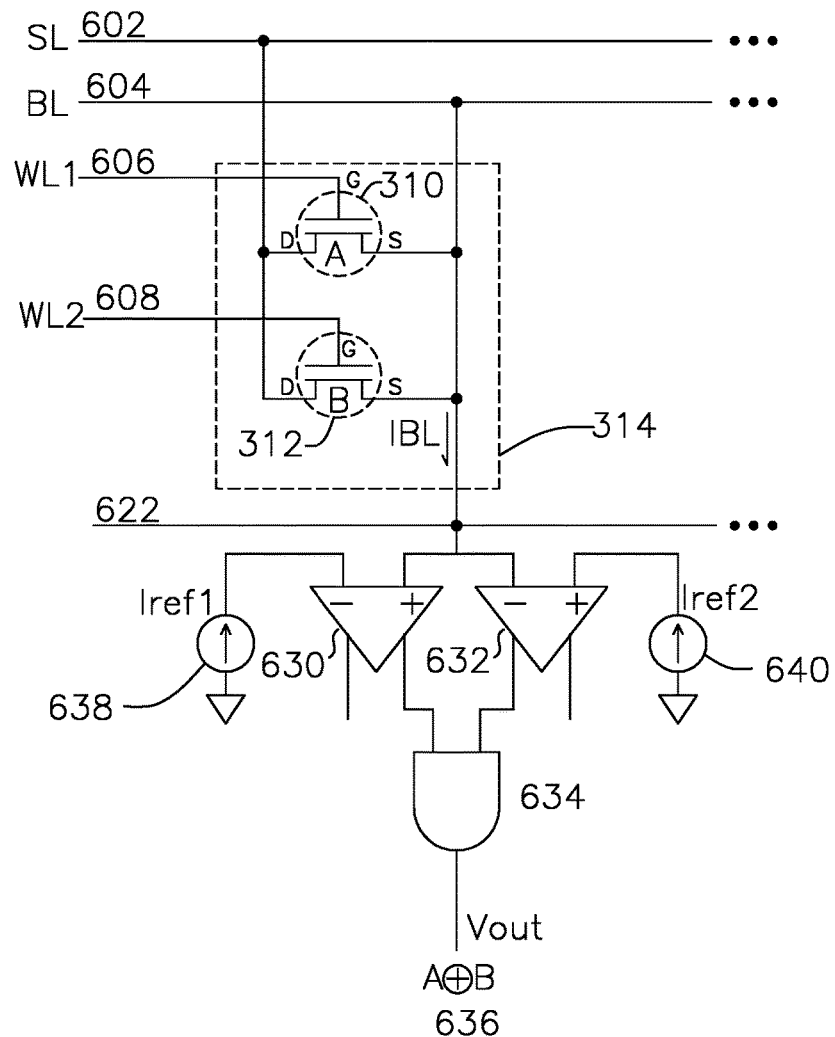
*Figure 6A*
1T/2T SRAM
XOR Operation
*Figure 6B*
IBL vs A,B Charge State (Iref=Iref11)
*Figure 6C*
| A | B | Vout |
|---|---|------|
| 0 | 0 | 0 |
| 0 | 1 | 1 |
| 1 | 0 | 1 |
| 1 | 1 | 0 |

ONE TRANSISTOR MEMORY BITCELL WITH ARITHMETIC CAPABILITY

FIELD OF THE INVENTION

The present invention relates to a memory. In particular, the invention is a memory configured to perform arithmetic operations.

BACKGROUND OF THE INVENTION

Processing electronics formed in microelectronics on a chip are useful for performing a wide variety of computational tasks. One consideration of computational systems is higher performance and lower cost, which may be achieved by integration of processing functions such as a Central Processing Unit (CPU) and memory such as Static Random Access Memory (SRAM) onto a single chip, where such a device is known as a System On a Chip (SOC). Processing functions are typically performed using the CPU which has an arithmetic logic unit (ALU) to perform various arithmetic functions such as OR/NOR, AND/NAND, or exclusive or (XOR) functions.

Prior art memory SRAM is constructed as the well-known "6T Memory Cell" 100 shown in FIG. 1, where 6T is a reference to the six transistors it uses. Storage transistors 112/114 and 116/118 comprise cross-coupled inverters, where the output of storage transistors 116/118 drives inputs of storage transistors 112/114, the output of storage transistors 112/114 drives the input of storage transistors 116/118. Because of the cross coupled inverter configuration, the state of storage transistors P Channel/N channel FETs 116/118 and P channel/N channel FETs 112/114 maintains a stable memory state until a greater drive current through transistors 110 and 120 overcomes the output drive of transistors 116/118 and 112/114 and changes the storage transistor memory state. The memory state is changed by driving bitline (BL) 122 and associated inverted bitline (/BL) 106 while asserting WR 104. The current driving capability of 110 and 120 is greater than the hold current maintaining the state of the storage transistors 112/114 and 116/118, and the storage transistors change state according to the input BL and complement /BL.

OBJECTS OF THE INVENTION

A first object of the invention is an arithmetic memory comprising:
- a first Single Transistor Static Random Access Memory (STSRAM) having a source, drain, and gate, and storing a charge value which influences a conductivity from the drain to the source when the gate is enabled;
- a second STSRAM having a source, drain, and gate, and storing a charge value which influences a conductivity from the drain to the source when the gate is enabled;
- a select line (SL line) coupled to the first STSRAM drain and also to the second STSRAM drain;
- a Bit Line (BL) node coupled to the first STSRAM source, the second STSRAM source, and to a noninverting input of a current comparator amplifier (CCA), the CCA having a negative terminal of the CCA coupled to a current source $I_{ref}$;
- the output of the CCA generating a binary output from a comparison of a sum of the currents from the drain to the source of both the first STSRAM and the second STSRAM against said $I_{ref}$.

A second object of the invention is a memory performing a logic OR operation or logical NOR operation, the memory comprising:
- a first Single Transistor Static Random Access Memory (STSRAM) having a source, drain, and gate, and storing a charge value which influences a conductivity from the drain to the source when the gate is enabled;
- a second STSRAM having a source, drain, and gate, and storing a charge value which influences a conductivity from the drain to the source when the gate is enabled;
- a select line (SL line) coupled to the first STSRAM drain and also to the second STSRAM drain;
- a Bit Line (BL) node coupled to the first STSRAM source, the second STSRAM source, and to a noninverting input of a current comparator amplifier (CCA), an inverting input of the CCA coupled to a current source $I_{ref}$;
- $I_{ref}$ being set to a current $I_{ref00}$ which is less than a BL node current when only one of the first STSRAM or second STSRAM has an associated charge greater than a BL node current when neither the first STSRAM or the second STSRAM has an associated charge;
- the first STSRAM and the second STSRAM BL providing a received BL node current to the noninverting input of the CCA, the received current being:
- a first value when a charge is not stored in the first STSRAM and the second STSRAM;
- a second value with a charge is stored in one of the first STSRAM or the second STSRAM;
- a third value when a charge is stored in both the first STSRAM and the second STSRAM
- the output of the CCA providing a first binary value when the received current is greater than $I_{ref00}$ and a second binary value when the received current is less than $I_{ref00}$.

A third object of the invention is a memory performing a logical AND or logical NAND operation, the memory comprising:
- a first Single Transistor Static Random Access Memory (STSRAM) having a source, drain, and gate, and storing a charge value which influences a conductivity from the drain to the source when the gate is enabled;
- a second STSRAM having a source, drain, and gate, and storing a charge value which influences a conductivity from the drain to the source when the gate is enabled;
- a select line (SL line) coupled to the first STSRAM drain and also to the second STSRAM drain;
- a Bit Line (BL) node coupled to the first STSRAM source and also to the second STSRAM source;
- the BL node providing a received current to an noninverting input of a current comparator amplifier (CCA), the CCA also having an inverting input coupled to a current $I_{ref}$, the received current being one of:
- a first value when charge is not stored in both the first STSRAM and the second STSRAM;
- a second value with charge is stored in one of the first STSRAM or the second STSRAM;
- a third value when charge is stored in both the first STSRAM and the second STSRAM;
- and where said $I_{ref}$ current is set to a value $I_{ref11}$ current, $I_{ref11}$ being a value between the second value and $I_{ref11}$ the third value;
- the CCA generating a digital output according to whether the received current is greater than or less than the $I_{ref11}$ current.

A fourth object of the invention is a memory performing a logical exclusive or (XOR) operation, the memory comprising:

a first Single Transistor Static Random Access Memory (STSRAM) having a source, drain, and gate, and storing a charge value which influences a conductivity from the drain to the source when the gate is enabled;

a second STSRAM having a source, drain, and gate, and storing a charge value which influences a conductivity from the drain to the source when the gate is enabled;

an SL line coupled to the first STSRAM drain and also to the second STSRAM drain;

a Bit Line (BL) node coupled to the first STSRAM source, the second STSRAM source, and to a noninverting input of a first current comparator amplifier (CCA) and also to an inverting input of a second CCA, the inverting input of the first CCA coupled to a current source $I_{ref1}$, the second CCA having a noninverting input coupled to a second current source $I_{ref2}$;

the first STSRAM and second STSRAM generating:
 a first current when a charge is not stored in both the first STSRAM and the second STSRAM;
 a second current when a charge is stored in only one of the first STSRAM or the second STSRAM;
 a third current when a charge is stored in both the first STSRAM and the second STSRAM;

the first CCA and the second CCA generating respective binary outputs by comparing a current at the noninverting input to a current at an inverting input of a respective first and second CCA;

where $I_{ref1}$ is a current greater than the second current and less than the third current and $I_{ref2}$ is a current greater than the first current and less than the second current.

the first CCA output and second CCA output coupled to an AND gate, thereby generating an exclusive OR logical output.

SUMMARY OF THE INVENTION

FIGS. 2A and 2B show a single transistor memory storage device 200, which provides a one transistor charge storage memory with lower power consumption and smaller footprint than the six transistor SRAM of FIG. 1. FIG. 2A is described in the publication "Bi-stable 1-/2 Transistor SRAM in 14 nm FinFET Technology for High Density/High Performance Embedded Applications". An equivalent field effect transistor is formed by drain 212, gate 206, and source 202, while a first junction NPN transistor is formed by N well 218, floating P well 210, and source 202, and a second junction NPN transistor is formed by N well 218, floating P well 210, and drain 212, as shown in equivalent circuit FIG. 2B. A charge storage capacitor is formed by the reverse biased interface of 210 and 218, which acts as the memory storing a charge, and the stored charge influences the conductance from drain 212 to source 202 when the gate 206 is activated by a voltage.

Each memory 200 is referred to as a single transistor static random access memory (STSRAM), and each memory 200 can be enabled by assertion of a gate voltage 206, which allows the charge value to be expressed as a drain 212 to source 202 conductivity. By using two memory structure shown in FIG. 2A, applying a voltage to the drain 212 terminals of the STSRAMs, separately enabling each gate as the two logic inputs, and measuring the resulting current generated at the source terminals of the STSRAMS, well known logic functions such as OR, NOR, AND, NAND, and XOR can be performed. A current comparator amplifier (CCA) compares the current which flows out of the STSRAM source terminals into a noninverting input of a current comparator amplifier (CCA) against a reference current applied to the noninverting CCA terminal to generate a binary output value. The CCA performs a current comparison between the inverting input and noninverting input with the inverting and noninverting inputs typically at 0V as shown in FIG. 3B for line 322, and the output is a binary voltage value known in the art of logic devices.

Various logic functions can be realized by changing the value of $I_{ref}$ applied to the CCA with respect to a current which results from charge stored in none, one, or two STSRAMs of the logical memory device.

In one example of the invention for in-memory computing, an n×m array of memory cells has a plurality of memory cells selectable by the gate (WL) terminal, and the plurality of memory cells sharing a source (BL) line generate a current $I_{BL}$ to a CCA connected to an associated BL line. Instantaneous logical operations may then be performed depending on where the $I_{ref}$ is set as shown in FIG. 3A, 4A, 5A or 6A, providing in-cell arithmetic computation compared to the prior art of reading a memory into a register and performing the logical operation shown in FIGS. 4C, 5C, and 6C of an external arithmetic logic unit.

BRIEF DESCRIPTION OF THE DRAWINGS

FIG. 4A is a schematic diagram of a two transistor SRAM for storing 2 bits of data and performing a NOR or OR operation result.

FIG. 4B is a plot of current vs charge state for operation of FIG. 4A.

FIG. 4C is a truth table for charge states of FIG. 4A.

FIG. 5A is a schematic diagram of a two transistor SRAM for storing 2 bits of charge data and performing a NOR or OR operation result.

FIG. 5B is a plot of current vs charge state for operation of FIG. 5A.

FIG. 5C is a truth table for charge states of FIG. 5A.

FIG. 6A is a schematic diagram of a two transistor SRAM for storing 2 bits of charge data and performing an exclusive or (XOR) operation result.

FIG. 6B is a plot of current vs charge state for operation of FIG. 6A.

FIG. 6C is a truth table for charge states of FIG. 6A.

DETAILED DESCRIPTION OF THE INVENTION

In the figures which follow, like reference numbers refer to like structures in various figures. A value which is indicated as "approximately" a nominal value is understood to be in the range of ½ the nominal value to 2× the nominal value. A value which is indicated as "on the order of" a nominal value is understood to be in the range from ⅒th of the nominal value to 10× the nominal value.

Figure 1:
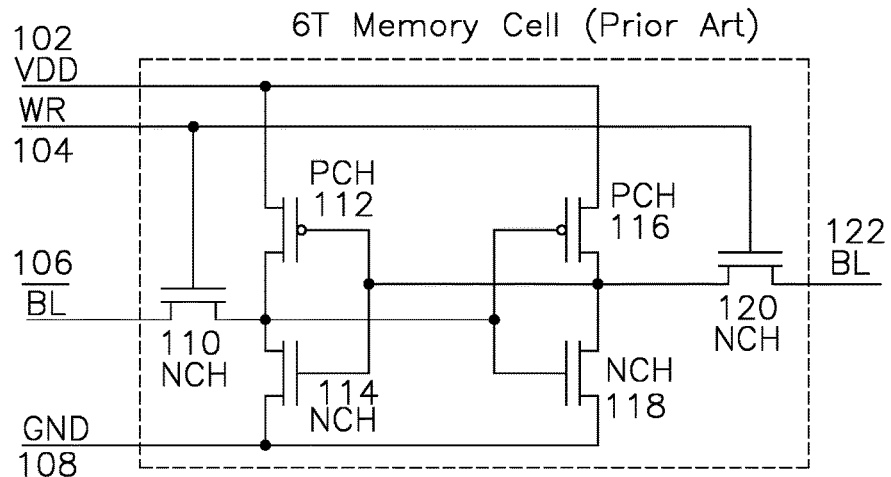
FIG. 1 is a schematic diagram of a prior art 6T static random access memory (SRAM) cell.

FIG. 1 shows a prior art six transistor memory cell, as described earlier, formed from P channel (PCH) field effect transistors (FET) 112 and 116 and N channel (NCH) field effect transistors 110, 114, 118, and 120. Transistors 112 and 114 form a first inverter, and transistors 116 and 118 form a second inverter, which are cross-connected to maintain a memory state for as long as VDD 102 is applied. The state changes when BL 122 (and /BL 106 which is complementary) are asserted with WR 104. Transistors 110 and 120 enabled by WR 104 have lower channel resistance and force the cross connected inverters 112/114 and 116/118 to switch state according to polarity of BL and its complement /BL.

Figure 2A:
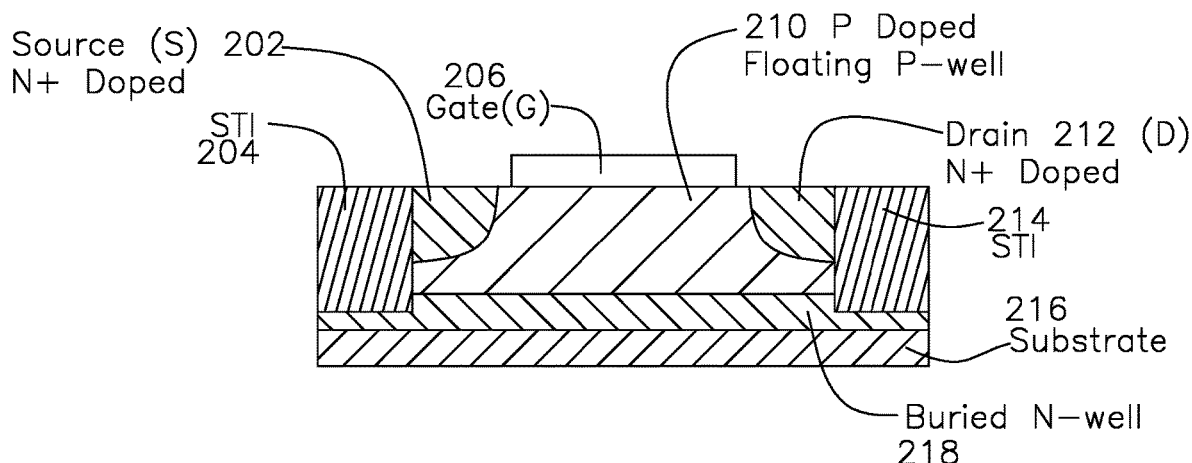
FIG. 2A is a cross section diagram of an SRAM cell with a compound single transistor.
Figure 2B:
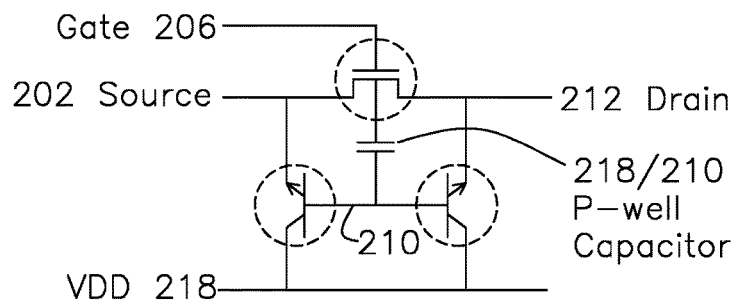
FIG. 2B is an equivalent circuit diagram of FIG. 2A.

FIG. 2A shows a single transistor SRAM (STSRAM) 200, comprising a P doped floating P-well 210 with source 202 comprising N+ doped and drain 212 also comprising N+ doped material on an opposite end, thereby forming a channel under gate 206, similar to a standard insulated gate FET. However, a reverse biased buried N-well 218 below P-well 210 creates a capacitor capable of storing charge, and 218, 210, 202 form a first junction transistor, and 218, 210, and 212 form a second junction transistor which is reverse biased in operation. FIG. 2B shows an equivalent circuit schematic diagram of FIG. 2A.

Figures 3A, 3B:
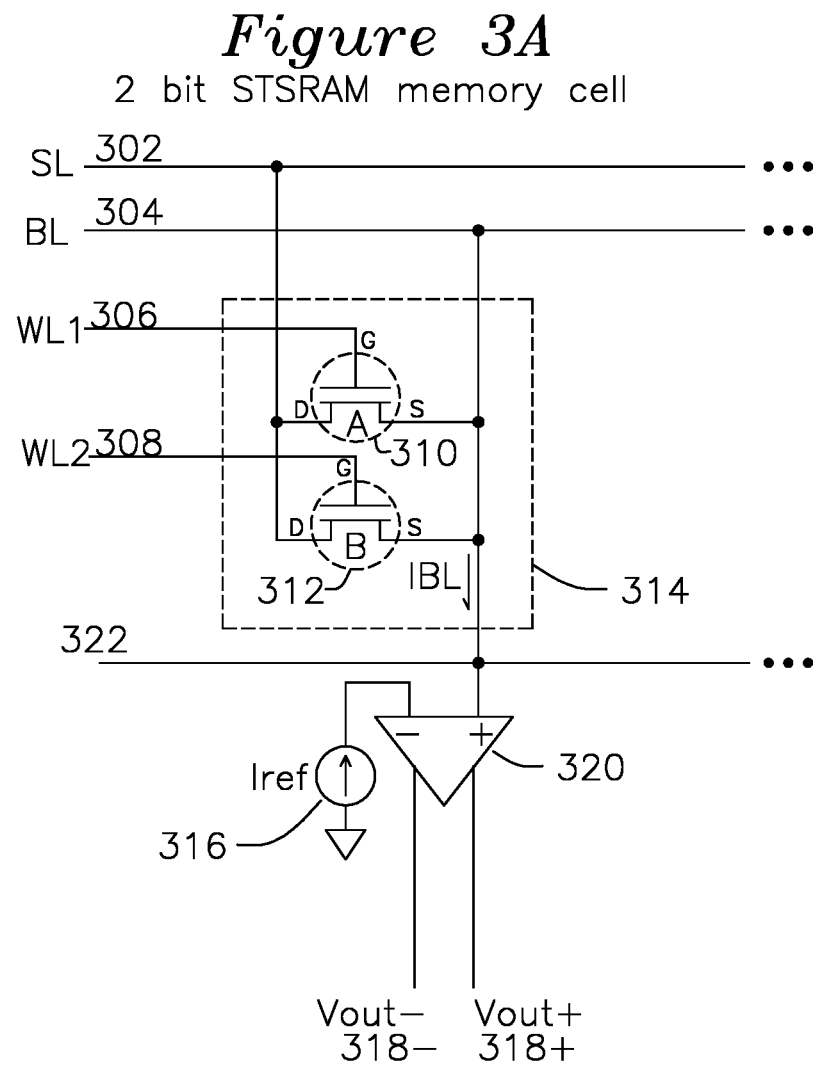
FIG. 3A is a schematic diagram of a two transistor SRAM for storing 2 bits of data and coupled to a current comparator.
FIG. 3B is a table of single transistor static random access memory (STSRAM) modes and terminal voltages.

FIG. 3A shows a two transistor SRAM 314, formed by first STSRAM 310 and second STSRAM 312, with the drain terminals connected to SL terminal 302, and source terminals connected to BL terminal 304, which is also coupled to noninverting input of current comparator amplifier (CCA) 320, which has an inverting input coupled to a current reference $I_{ref}$ 316. CCA 320 generates a noninverting output 318+ and inverting output 318− which are mutually complementary binary outputs. The CCA 320 compares the BL node 304 current $I_{BL}$ at the noninverting input of the CCA with $I_{ref}$ 316 of the inverting input of the CCA 320 and generates the binary complementary outputs 318+ and 318− based on the comparison of input currents to the CCA, and from which additional logic operations may be performed. In practice, each memory cell 314 is independently readable and writeable as shown in FIG. 3B. Combined read and logic operations may be performed during read operations by assertion of select line (SL 302) with WL1 and WL2 as individually shown in FIG. 3B. A 1 is written to an STSRAM cell using an example 0.8V applied to the STSRAM gate (WL1 306 or WL2 308) and drain (D 302) terminals with the source (S 304) at 0V (the input condition of the CCA), and a 0 is written to the cell using an example −0.3V applied to the gate and drain with the source (noninverting input of the CCA) at 0V. The cell is ordinarily read by measuring the current $I_{BL}$ at 0V with the gate at 0.4V and drain at 0.2V as enumerated in the table of FIG. 3B. $I_{ref}$ may be changed to different levels and the positive or negative polarity output of the CCA may be selected to perform AND, NAND, OR, or NOR logic operations concurrent with memory cell read operations, by mere selection of $I_{ref}$ CCA output polarity selection.

FIG. 4A shows the two STSRAMs 314 configured as a two bit memory which performs a NOR (with output Vout− 418−) or OR (with output Vout+ 418+) operation for various charge states shown in FIG. 4B and the truth table of FIG. 4C. The discrete charge state contained by each of STSRAM A 310 and STSRAM B 312 enabled by WL1 306 and WL2 308 changes the current $I_{BL}$ that is generated in the read mode of operation, as shown in FIG. 4B for various $I_{BL}$ values associated with the A 310 and B 312 charge states of the associated STSRAMs 310 and 312, where the minimum $I_{BL}$ 454 is associated with charge corresponding to 0 for both A 310 and B 312, a median $I_{BL}$ 452 associated with one of the STSRAM 310 or 312 storing a 1 (charge) and the other SSTSRAM storing a 0 (no charge). Plot 450 is associated with both STSRAM 310 and 312 having a 1 (charge). The various charge states and logical outputs are shown in FIG. 4C.

FIG. 5A shows the two STSRAMs 314 configured as a two bit memory which performs a NAND (with output Vout− 518−) or AND (with output Vout+ 518+) operation for various charge states shown in FIG. 5B and the truth table of FIG. 5C. The greater the number of discrete charges contained by STSRAM A 310 and STSRAM B 312, the greater the current $I_{BL}$ that is generated in the read mode of operation as in the OR/NOR operation of FIG. 4B, but $I_{ref}$ 316 is set to just below the charge state for both STSRAM cells having 1, as shown in FIG. 5B. As before, charge state 550 corresponds to both STSRAM cells having a 1 charge, state 552 corresponds to a single STSRAM cell having a 1 charge and the other a 0 charge, and charge state 554 corresponds to both STSRAM cells 310 (A) and 312 (B) having a 0 stored charge. The various charge states and logical outputs are shown in FIG. 5C.

FIG. 6A shows the two STSRAMs 310 (A) and 312 (B) of cell 314 configured as a two bit memory which performs an exclusive OR (XOR) operation for various charge states shown in FIG. 6B and the truth table of FIG. 6C. A slightly different configuration is used for the XOR operation, where the charge states 654, 652, and 650 of FIG. 6B relate to increasing read charge for the various charge states for STSRAM cells 310 (A) and 312 (B), as before, current 654 associated with both STSRAM cells having 0 charge, current 652 associated with a single STSRAM cell having a 1 charge and the other a 0 charge, and 650 associated with both STSRAM cells having a 1 charge. For the XOR logic, two CCAs, a first CCA 630 and second CCA 632 are required, with the first CCA 630 having a noninverting input coupled to measure $I_{BL}$ on node 604 and compare with $I_{ref1}$ 638 fed into the inverting terminal of CCA 630, where $I_{ref1}$ is set to just below the maximum of both STSRAM cells 310 and 312 storing a 1 corresponding to $I_{BL}$ 650 in FIG. 6B and above a current $I_{BL}$ associated with a single one of the STSRAMs of the two STSRAMs storing a 1 652. The second CCA 632 also has its inverting input coupled to 604 for measurement of $I_{BL}$ and comparison with $I_{ref2}$ 640 connected to the noninverting terminal of 632, shown in FIG. 6B with $I_{ref2}$ slightly above $I_{BL}$ 654 corresponding to the current generated by the two STSRAM cells with charge corresponding to 0 and less than the current $I_{BL}$ generated by a single STSRAM cell with charge corresponding to 1. The outputs of first CCA 630 and second CCA 632 are ANDed by gate 634 to generate output 636, as shown in the truth table of FIG. 6C.

An array of computational memory cells may be formed from the structures described in FIGS. 3A, 4A, 5A, and 6A. When used in an array, the select line (SL 302) may be used to select a column of memory cells 314, with the outputs carried by bitlines 304 to a common CCA such as 320. Individual WL lines such as 306 and 308 may then be enabled to determine which cells participate in a particular computation.

Many variations of the invention are possible, the examples shown are for illustrative purposes only, and are not intended to limit the invention to only the embodiments shown. In particular, references to a logic 0 level or logic 1 level and associated currents $I_{BL}$ are specific to the STSRAM characteristics, as are the particular voltages shown in FIG. 3B.

We claim:

1. An arithmetic memory comprising:
a first Single Transistor Static Random Access Memory (STSRAM) having a source, drain, and gate, and storing a charge value which modifies a conductivity from the drain to the source when the gate is enabled;
a second STSRAM having a source, drain, and gate, and storing a charge value which modifies a conductivity from the drain to the source when the gate is enabled;
a select line (SL) coupled to the first STSRAM drain and also to the second STSRAM drain;
a current comparator amplifier (CCA) having a noninverting input and an inverting input, the CCA asserting a binary output when a sum of currents applied to the CCA noninverting input is greater than a current $I_{ref}$ applied to the inverting input of the CCA;
a Bit Line (BL) node coupled to the first STSRAM source, the second STSRAM source, and to the noninverting input of the CCA;
the CCA output configured to output at least one of an OR, NOR, AND, or NAND operation, and where the charge value of the first STSRAM and the charge value of the second STSRAM provides the sum of currents.

2. The arithmetic memory of claim 1 where each of the first STSRAM and the second STSRAM further comprises a respective STSRAM P-well having a respective STSRAM drain and a respective STSRAM source, each respective STSRAM P-well further comprising N+ doped regions on opposite ends of the respective STSRAM P-well, each respective STSRAM P-well having a respective STSRAM gate located on a surface of the respective STSRAM P-well and positioned between the respective STSRAM source and the respective STSRAM drain.

3. The arithmetic memory of claim 2 where each respective STSRAM P-well comprises a floating P-well having a respective buried N-well on an opposite surface from the respective STSRAM gate which is formed on a surface of the respective buried N-well, the respective buried N-well and respective floating P-well forming a capacitor storing the charge value.

4. The arithmetic memory of claim 2 where the $I_{ref}$ current is set to a value greater than a current $I_{BL}$ associated with both the first STSRAM and second STSRAM having a charge corresponding to a logic 0.

5. A logic memory storing two charges and performing a logic operation on the two charges, the logic memory comprising:
a first Single Transistor Static Random Access Memory (STSRAM) having a source, drain, and gate, and storing a charge value which modifies a conductivity from the drain to the source when the gate is enabled;
a second STSRAM having a source, drain, and gate, and storing a charge value which modifies a conductivity from the drain to the source when the gate is enabled;
a select line (SL) coupled to the first STSRAM drain and also to the second STSRAM drain;
a Bit Line (BL) node coupled to the first STSRAM source, the second STSRAM source, and to a noninverting input of a current comparator amplifier (CCA) generating a binary result by comparing a current $I_{BL}$ applied to the noninverting input of the CCA to a current $I_{ref}$ applied to an inverting input of the CCA, the inverting input of the CCA coupled to a current source $I_{ref}$;
a current $I_{BL}$ through the first STSRAM and second STSRAM thereby having:
a first value when a charge is not stored in the first STSRAM and the second STSRAM;
a second value with a charge is stored in one of the first STSRAM or the second STSRAM;
a third value when a charge is stored in both the first STSRAM and the second STSRAM;
the CCA having an output performing a logic operation governed by a setting of $I_{ref}$ and selection of a polarity of the output.

6. The logic memory of claim 5 where a voltage is applied to the SL line and the gates of the first and second STSRAM to generate the logic operation.

7. The logic memory of claim 5 where the logic operation is an OR or NOR function and $I_{ref}$ is set to a value between an $I_{BL}$ associated with both STSRAMs storing a 0 and an $I_{BL}$ associated with one of the two STSRAMs storing a 1.

8. The logic memory of claim 5 where the logic operation is an AND or NAND function and $I_{ref}$ is set to a value less than an $I_{BL}$ associated with both STSRAMs storing a 1 and an $I_{BL}$ associated with only one of the two STSRAMS storing a 1.

9. A memory performing a logical AND or logical NAND operation, the memory comprising:
a first Single Transistor Static Random Access Memory (STSRAM) having a source, drain, and gate, and storing a charge value which influences a conductivity from the drain to the source when the gate is enabled;
a second STSRAM having a source, drain, and gate, and storing a charge value which influences a conductivity from the drain to the source when the gate is enabled;
a select line (SL) coupled to the first STSRAM drain and also to the second STSRAM drain;
a Bit Line (BL) node coupled to the first STSRAM source, the second STSRAM source, and to a noninverting input of a current comparator amplifier (CCA), the CCA having an inverting input coupled to a current source $I_{ref}$, the CCA generating a binary output by comparing a combined current $I_{BL}$ from the first STSRAM and second STSRAM delivered to the noninverting input of the CCA to a current $I_{ref}$ delivered to the inverting input of the CCA;
$I_{ref}$ being set to a current $I_{ref11}$ which is greater than $I_{BL}$ when only one of the first STSRAM or second STSRAM has a stored charge;
the first STSRAM and the second STSRAM having respective stored charge which generate to the noninverting input of the CCA:
a first current when a charge is not stored in the first STSRAM and the second STSRAM;
a second current when a charge is stored in one of the first STSRAM or the second STSRAM;
a third current when a charge is stored in both the first STSRAM and the second STSRAM.

10. The memory of claim 9 where at least one of the first STSRAM or the second STSRAM comprises a floating P-well having the source and the drain formed into the floating P-well, and the gate adjacent to the floating P-well and on a surface of the floating P-well between the source and the drain.

11. The memory of claim 9 where the SL line and the gate are both asserted during an interval of writing a 1 to the first STSRAM or the second STSRAM.

12. The memory of claim 9 where during a read operation of the first STSRAM or the second STSRAM, an associated drain voltage is half of an associated gate voltage.

13. The memory of claim 9 where a memory write operation of the first STSRAM or the second STSRAM is performed by asserting the gate and an associated drain to a negative voltage compared to the source.

14. The memory of claim 9 where the SL line and the BL line are associated with other memory devices.

15. A memory performing a logical exclusive or (XOR) operation, the memory comprising:
- a first Single Transistor Static Random Access Memory (STSRAM) having a source, drain, and gate, and storing a charge value which influences a conductivity from the drain to the source when the gate is enabled;
- a second STSRAM having a source, drain, and gate, and storing a charge value which influences a conductivity from the drain to the source when the gate is enabled;
- a select line (SL) coupled to the first STSRAM drain and also to the second STSRAM drain;
- a first current comparator amplifier (CCA) having an inverting input and a noninverting input, the first CCA generating a binary output by comparison of a current applied to the inverting input and a current applied to the noninverting input;
- a second current comparator amplifier (CCA) having an inverting input and a noninverting input, the second CCA generating a binary output by comparison of a current applied to the inverting input and a current applied to the noninverting input;
- a Bit Line (BL) node coupled to the first STSRAM source, the second STSRAM source, and to the noninverting input of the first CCA and also to the inverting input of the second CCA;
- the first CCA inverting input coupled to a first current source $I_{ref1}$, the second CCA noninverting input coupled to a second current source $I_{ref2}$;
- the first CCA output and second CCA output coupled to an AND gate forming an exclusive OR logical output.

16. The memory of claim 15 where at least one of the first STSRAM or the second STSRAM comprises a floating P-well having the source and the drain formed into the floating P-well, and the gate adjacent to the floating P-well and on a surface of the floating P-well between the source and the drain.

17. The memory of claim 15 where the SL line and the gate are both asserted during an interval of writing a 1 to the first STSRAM or the second STSRAM.

18. The memory of claim 15 where during a read operation of the first STSRAM or the second STSRAM, an associated drain voltage is half of an associated gate voltage.

19. The memory of claim 15 where a memory write operation of the first STSRAM or the second STSRAM is performed by asserting the gate and an associated drain to a negative voltage compared to the source.

20. The memory of claim 15 where the SL line and the BL line are associated with other memory devices.

* * * * *